(12) United States Patent
Liu et al.

(10) Patent No.: US 7,911,273 B2
(45) Date of Patent: Mar. 22, 2011

(54) REDUCTION OF POWER CONSUMPTION AND EMI OF A SWITCHING AMPLIFIER

(75) Inventors: Jing-Meng Liu, Jubei (TW); Jwin-Yen Guo, Zhubei (TW); Shao-Ming Sun, Zhubei (TW)

(73) Assignee: Richtek Technology Corp., Hsinchu (TW)

( * ) Notice: Subject to any disclaimer, the term of this patent is extended or adjusted under 35 U.S.C. 154(b) by 63 days.

(21) Appl. No.: 12/382,762

(22) Filed: Mar. 24, 2009

(65) Prior Publication Data
US 2009/0243722 A1 Oct. 1, 2009

(30) Foreign Application Priority Data
Mar. 25, 2008 (TW) ............................. 97110628 A

(51) Int. Cl.
*H03F 3/217* (2006.01)

(52) U.S. Cl. .................................. 330/251; 330/207 A
(58) Field of Classification Search .................... 330/10, 330/207 A, 251
See application file for complete search history.

(56) References Cited

U.S. PATENT DOCUMENTS
7,312,654 B2 * 12/2007 Roeckner et al. ............... 330/10
* cited by examiner

*Primary Examiner* — Steven J Mottola
(74) *Attorney, Agent, or Firm* — Rosenberg, Klein & Lee

(57) ABSTRACT

A switching amplifier has a network including current sources and resistors connected to the two output terminals of the H-bridge of the switching amplifier, to provide a small current to the load connected between the two output terminals at zero input, whereby the common mode voltage bouncing is reduced and the switching amplifier has less power consumption and reduced electro-magnetic interference.

29 Claims, 10 Drawing Sheets

US 7,911,273 B2

REDUCTION OF POWER CONSUMPTION AND EMI OF A SWITCHING AMPLIFIER

FIELD OF THE INVENTION

The present invention is related generally to switching amplifiers and, more particularly, to an apparatus and method for reducing the power consumption and electro-magnetic interference (EMI) of a switching amplifier.

BACKGROUND OF THE INVENTION

Audio power amplifiers of conventional design suffer from low efficiency, and this causes these designs to generate heat that must be removed by large heat sinks, causing the physical amplifier designs to be quite large. In order to make amplifiers smaller, high-efficiency designs have been proposed. Switching amplifiers, also known as class-D amplifiers, are analogous to switching regulators, and so have similar advantage, when compared to class-AB amplifiers, in efficiency and its derivatives, i.e., lower thermal dissipation, longer battery life, smaller power supplies, size, weight, etc. These amplifiers work by converting the analog or digital input signal into a 2-level output signal using a high-frequency modulation process. This 2-level signal is then fed to a power stage to switch the power switches of either a full H-bridge or a half H-bridge. These power switches operate with low switching loss, and thus significantly improve the efficiency of the amplifiers. For switching amplifiers, most prior-art systems employ a pulse width modulation (PWM) scheme. A typical audio PWM amplifier can work at a switching frequency of between 100 KHz ad 500 KHz. Higher switching frequencies will reduce distortion but also result in lower efficiency due to the extra transitions in the output waveform.

FIG. 1 is a circuit diagram of a conventional audio PWM switching amplifier, which includes a full H-bridge 10 and a controller 12. The H-bridge 10 is constructed by four power switches M1-M4 connected between a power supply Vdd and a ground terminal GND. The controller 12 provides PWM signals PWM_P and PWM_N according to an input signal Vin, to switch the power switches M1-M4 so as to generate a differential output voltage OUT=OUTP−OUTN between two output terminals OUTP and OUTN, which is filtered by a low-pass filter (LPF) 14 to filter out audio components contained therein before being applied to a load 16. In further detail, FIG. 2 is a circuit diagram of a conventional PWM generator, in which a comparator CMP compares the input signal Vin with a trianglewave signal Vt to generate the PWM signals PWM_P and PWM_N in opposite phases to each other. Hence, as shown in FIG. 3, the voltage at the positive output terminal OUTP switches between 0 and Vdd, the voltage at the negative output terminal OUTN is in opposite phase to OUTP, and the differential output voltage OUT switches between Vdd and −Vdd. The load current IL decays in the inductors L1 and L2 during the time period of the differential output voltage OUT at −Vdd, and re-establishes in the opposite direction during the period of the differential output voltage OUT at Vdd. Since the output squarewave OUT has the amplitude of 2Vdd and has the duty of 50% when the input signal Vin is zero, the load current IL will have a great ripple and the equivalent series resistance (ESR) of the LPF 14 will cause a great power consumption.

On the other hand, the output filter 14 will reduce the efficiency of the switching amplifier and typically includes external inductors L1, L2 and capacitors C1-C3 which are expensive and consume undesirable amounts of space. Therefore, filterless switching amplifiers have been proposed. However, this will require that the load 16 be inductive. Considering a pure resistive load 16, switching the H-bridge 10 in a binary fashion would place the power supply voltage Vdd across the load 16. Unlike the current waveform IL shown in FIG. 3, the resulting load current IL would be a squarewave with a magnitude equal to the power supply voltage Vdd divided by the resistance of the load 16, and this is with no signal. Although the electrical equivalent of a speaker is somewhere between purely resistive and purely inductive, this would still prevent filterless switching amplifiers in audio applications as the main benefit of efficiency is lost. Even in case of inductive loads, for operation near zero crossing, or no audio signal (Vin=0), the majority of the load current IL is wasted, and is a drop in efficiency, in addition that high electro-magnetic interference (EMI) is produced. Disclosed in U.S. Pat. Nos. 6,262,632 and 6,211,728 is a filterless switching amplifier having a ternary modulation scheme implemented in an H-bridge configuration to eliminate the zero-input load current IL, which operates the H-bridge 10 with a common mode for zero crossing state, by which the two opposite terminals OUTP, OUTN of the load 16 are simultaneously switched between the power supply Vdd and the ground terminal GND. In further detail, at zero input, the H-bridge 10 is switched between two states, one is that the transistors M1, M3 are both turned on to apply the power supply voltage Vdd to the output terminals OUTN, OUTP, and the other is that the transistors M2, M4 are both turned on to ground the output terminals OUTN, OUTP. Consequently, there is no current wasted at zero input. However, the common mode voltage bounces between 0 and Vdd, and this would still cause severe EMI.

Disclosed in U.S. Pat. Nos. 6,847,257 and 6,970,123 are apparatus and methods to reduce the output voltage amplitude and the common mode voltage difference in filterless switching amplifiers. FIG. 4 is a circuit diagram showing the PWM generator used therein, in which, in addition to a comparator CMP to compare the input signal Vin with a trianglewave signal Vt to generate the positive PWM signal PWM_P, another comparator CMP1 is used to compare a signal Vin1 which is an inverse to the input signal Vin, with the same trianglewave signal Vt to generate the negative PWM signal PWM_N. FIG. 5. is waveform diagram showing the differential pair Vin, Vin1 and illustrating how they determine the waveform of the PWM signals OUTP, OUTN. This method reduces the output waveform amplitude OUT of the switching amplifier to Vdd and thus reduces the EMI. However, a minimum pulse width is required for the common mode operation, in order to maintain a non-zero load current at zero input.

SUMMARY OF THE INVENTION

An object of the present invention is to reduce the power consumption of a switching amplifier at zero input.

Another object of the present invention is to reduce the EMI of a switching amplifier at zero input.

It is the common mode voltage bouncing between two values to cause EMI when a switching amplifier is at zero input. To eliminate this EMI, therefore, a small current may be provided to flow through the load of a switching amplifier at zero input, to thereby maintain a constant common mode voltage.

According to the present invention, to reduce the power consumption and EMI of a switching amplifier, a first current source and a first resistor are connected in series between a power input terminal and a first output terminal, and a second current source and a second resistor are connected in series between a second output terminal and a ground terminal. This circuit will supply a small current to the load of the switching amplifier at zero input and thus eliminate the common mode voltage bouncing.

According to the present invention, a method for reducing the power consumption and EMI of a switching amplifier includes connecting a network having current sources and resistors to the two output terminals of the switching amplifier, and providing a small current by the network to the load of the switching amplifier at zero input to eliminate the common mode voltage bouncing.

According to the present invention, a switching amplifier includes an H-bridge and two output terminals drawn therefrom, a controller to switch the H-bridge according to an input signal to generate a differential output voltage between the two output terminals, and a network having current sources and resistors connected to the two output terminals. In zero input operation, a small current is provided to the load between the two output terminals to eliminate the common mode voltage bouncing.

According to the present invention, a control method for a switching amplifier includes switching an H-bridge according to an input signal to generate a differential output voltage between two output terminals in a first state, switching the H-bridge to generate a common mode voltage across the two output terminals according to the input signal in a second state, and providing a small current to the load between the two output terminals to eliminate the common mode voltage bouncing.

It is therefore offered a solution by adding current sources to a switching amplifier, to reduce not only the power consumption at zero input but also the EMI effect by keeping the common mode voltage constant.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1:
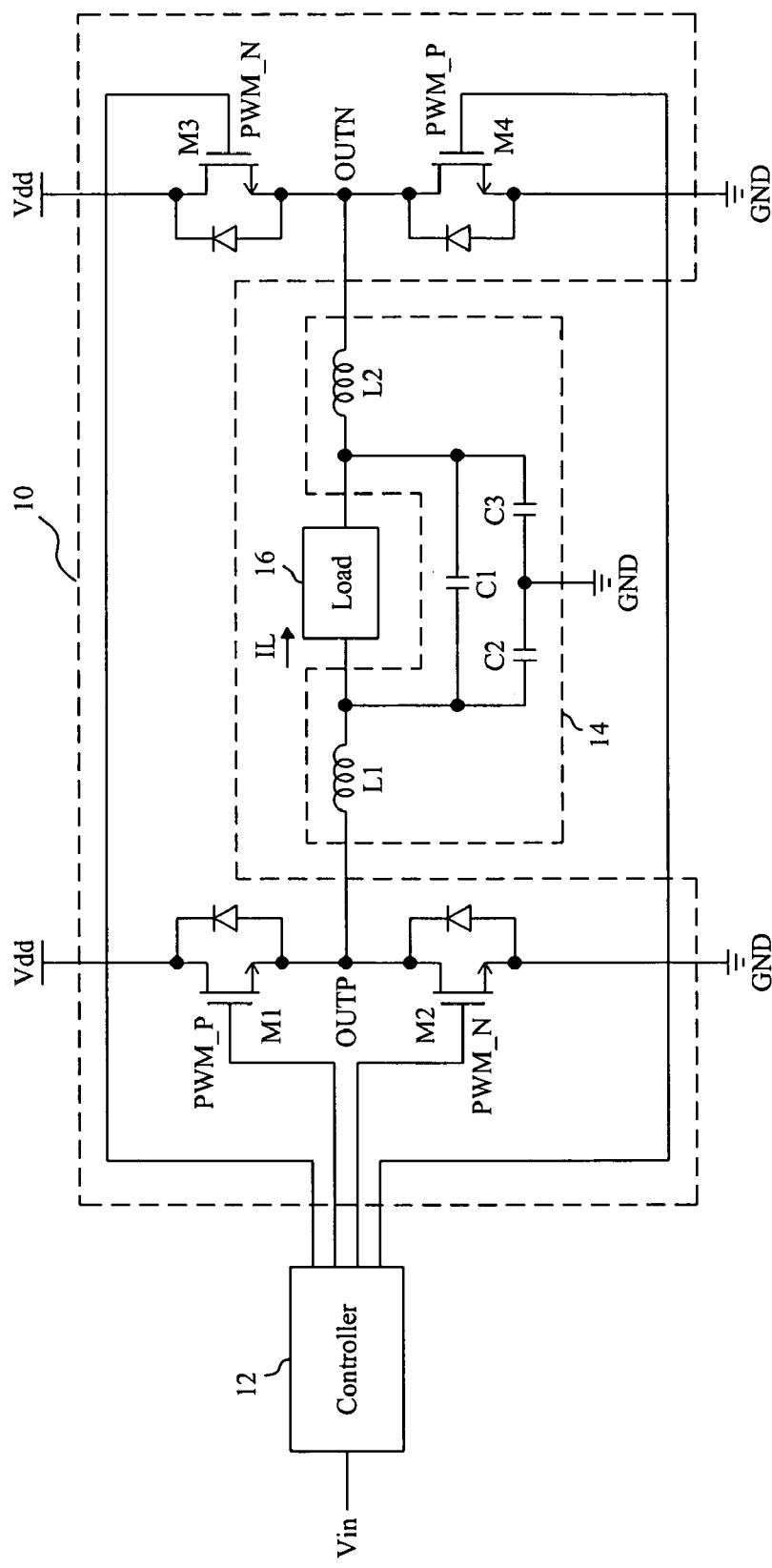
FIG. 1 is a circuit diagram of a conventional audio PWM switching amplifier.
Figure 2:
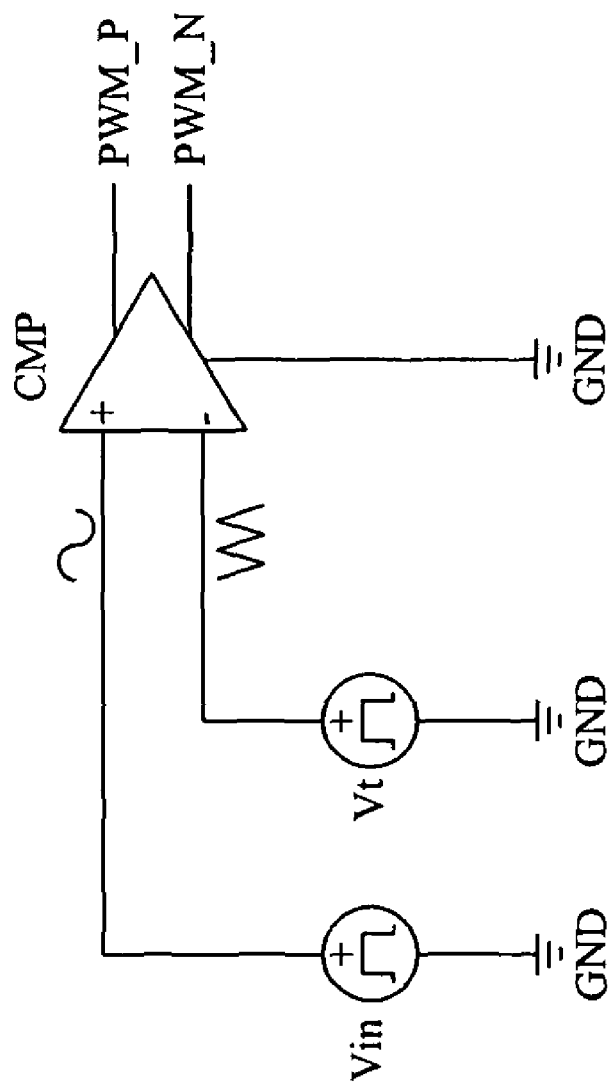
FIG. 2 is a circuit diagram of a conventional PWM generator.
Figure 3:
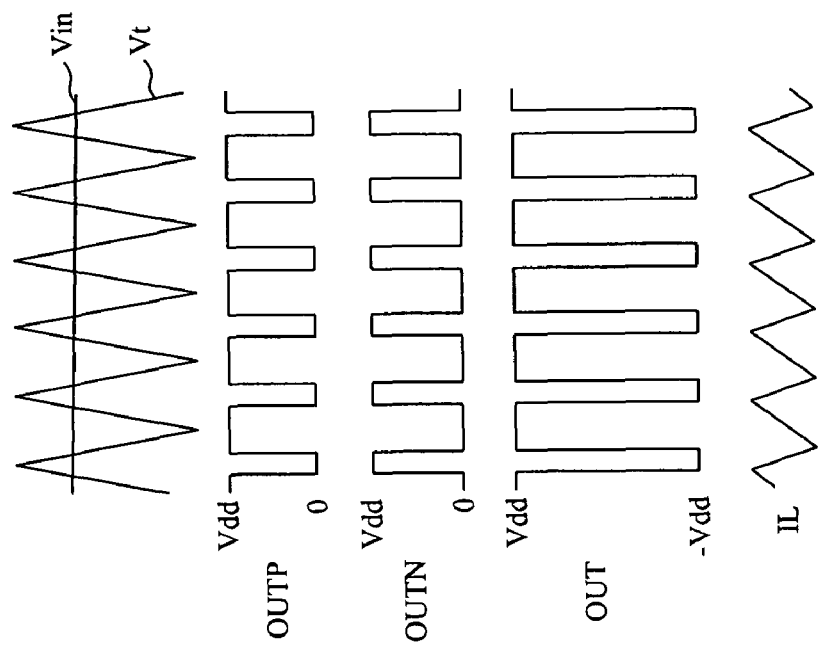
FIG. 3 is a waveform diagram of the PWM signals of a conventional switching amplifier.
Figure 4:
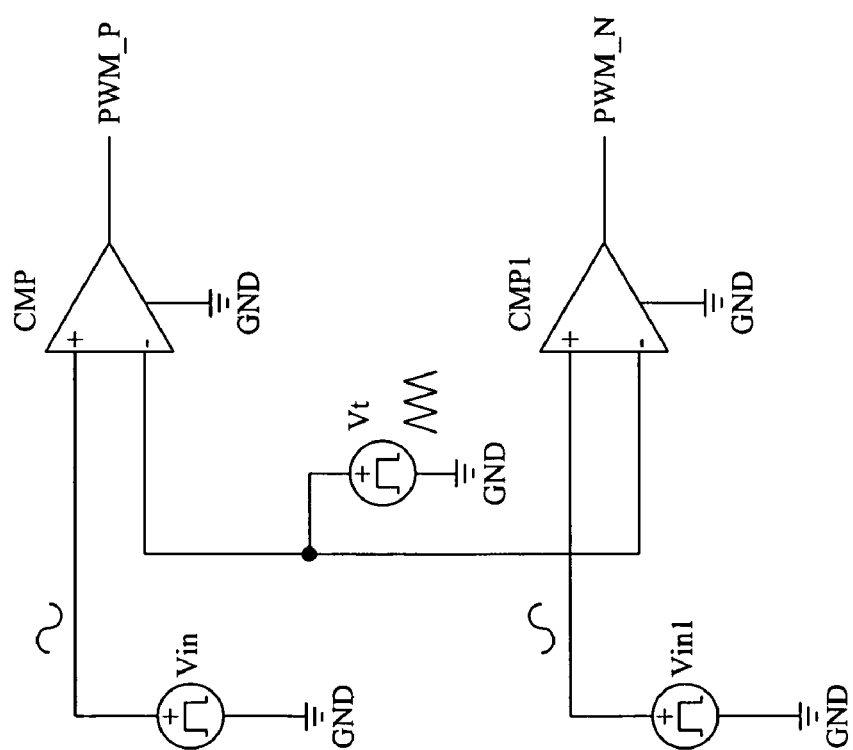
FIG. 4 is a circuit diagram of a conventional differential PWM generator.
Figure 5:
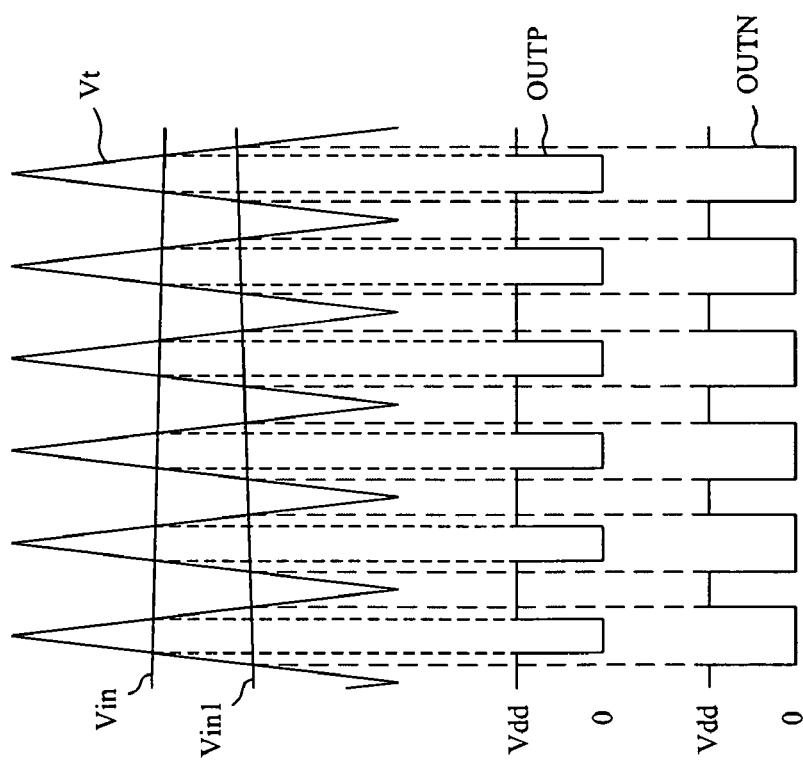
FIG. 5 is a waveform diagram of the PWM signals of a conventional differential switching amplifier.
Figure 6:
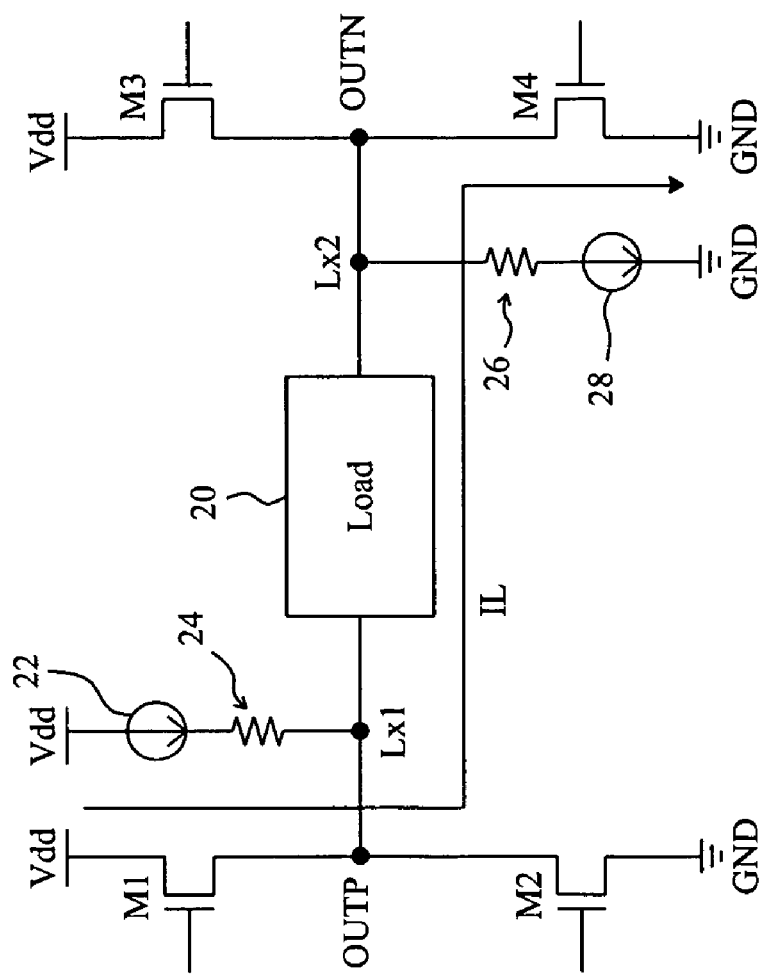
FIG. 6 is a circuit diagram of a first embodiment according to the present invention at non-zero input.
Figure 7:
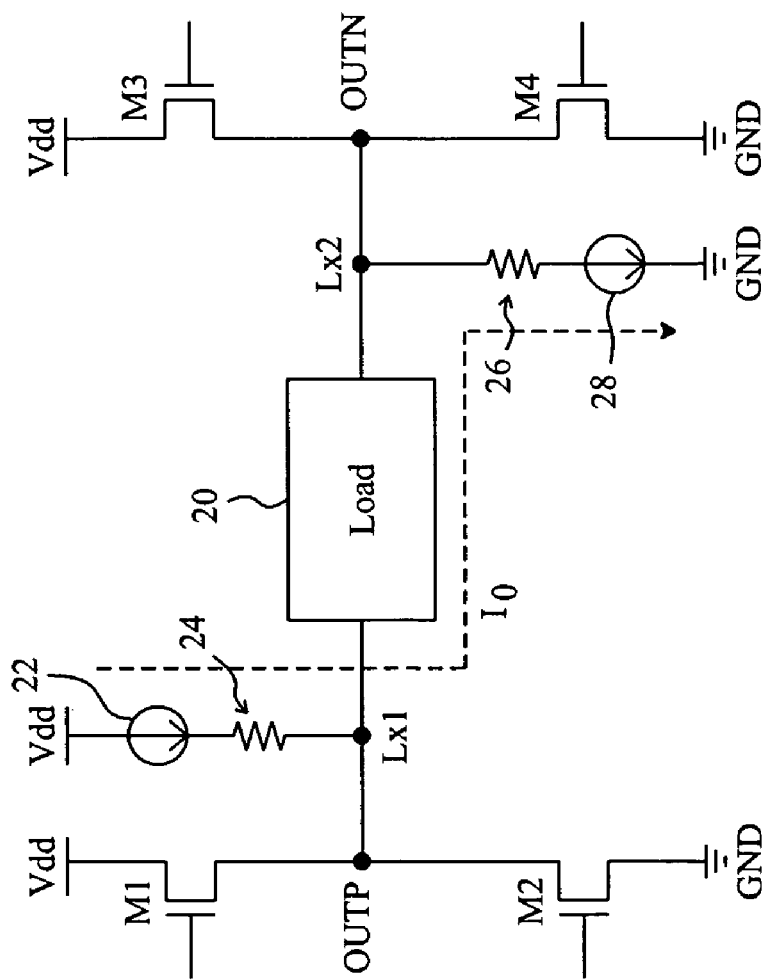
FIG. 7 is a circuit diagram of the first embodiment according to the present invention at zero input.

FIG. 6 is a circuit diagram of a first embodiment according to the present invention at non-zero input, in which the controller and input signal of the switching amplifier are omitted from depiction. A load 20 is connected between output terminals OUTP and OUTN, a current source 22 and a resistor 24 are connected in series between a power supply Vdd and a node Lx1, and a resistor 26 and a current source 28 are connected in series between a node Lx2 and a ground terminal GND. When the input signal Vin has a positive or negative value, the output stage works as a normal ternary modulation switching amplifier. In this case, the output current IL is mainly supplied from the power switches of the H-bridge during the period, and the additional sourcing current would not affect the function. In normal operation, the current supplied by the current sources 22 and 28 is much less than the current IL supplied by the H-bridge to the load 20. However, as shown in FIG. 7, as the input signal Vin approaches zero, the current sources 22 and 28 would dominate and supply a small current $I_0$ to introduce a small value voltage drop across the load 20. Therefore, the current across the load 16 during the zero input is small and the power consumption is reduced. Unlike prior arts, which are necessary to generate a minimum pulse width to maintain a small current at zero input, the current $I_0$ in this embodiment is offered by the additional current sources 22 and 28. This small current $I_0$ reduces the common mode voltage bouncing at zero input, and thus reduce the EMI effect. In this embodiment, the small current $I_0$ is less than 10 μA.

Figure 8:
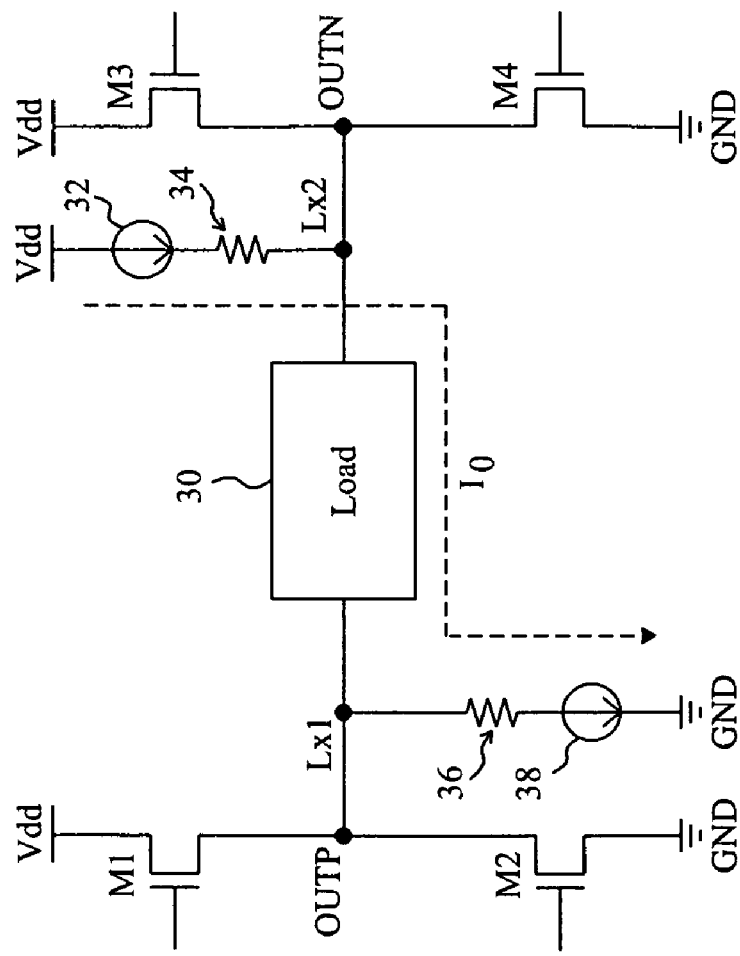
FIG. 8 is a circuit diagram of a second embodiment according to the present invention.

FIG. 8 is a circuit diagram of a second embodiment according to the present invention, in which a current source 32 and a resistor 34 are connected in series between a power supply Vdd and a node Lx2, and a resistor 36 and a current source 38 are connected in series between a node Lx1 and a ground terminal GND, by which a small current $I_0$ is provided to generate a small voltage across the load 30 between the nodes Lx1 and Lx2 at zero input. This circuit operates identically to that of FIG. 6.

Figure 9:
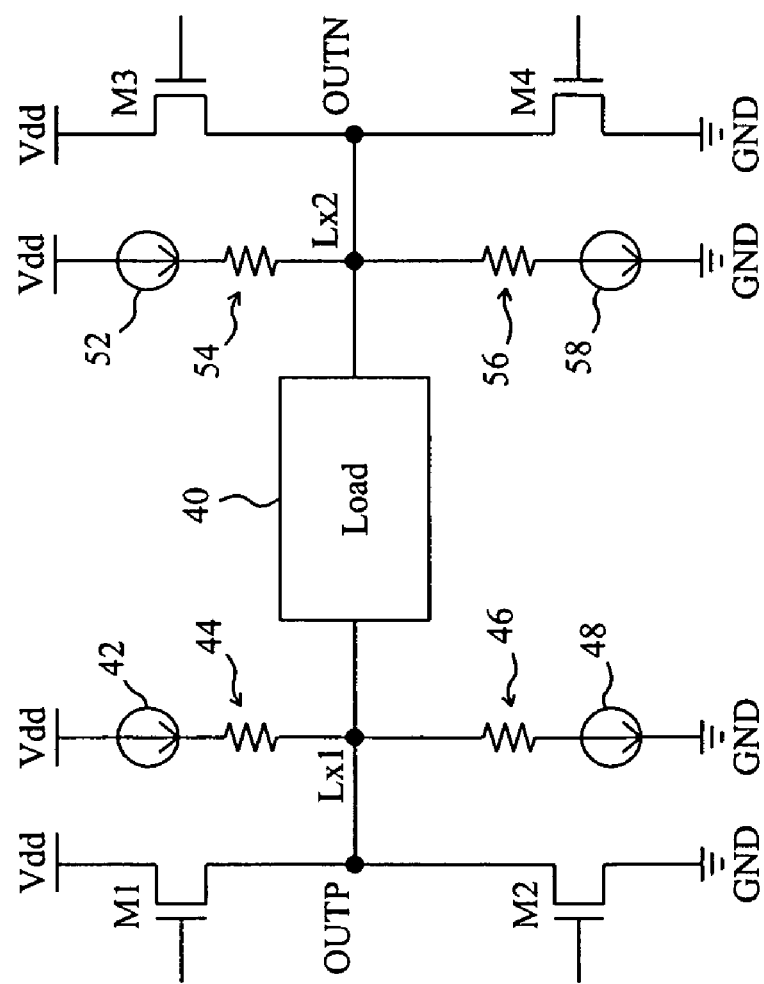
FIG. 9 a circuit diagram of a third embodiment according to the present invention.

FIG. 9 is a circuit diagram of a third embodiment according to the present invention, in which a current source 42 and a resistor 44 are connected in series between a power supply Vdd and a node Lx1, a resistor 46 and a current source 48 are connected in series between the node Lx1 and a ground terminal GND, a current source 52 and a resistor 54 are connected in series between the power supply Vdd and a node Lx2, and a resistor 56 and a current source 58 are connected in series between the node Lx2 and the ground terminal GND. Thereby, a small voltage will be present across the load 50 between the nodes Lx1 and Lx2 at zero input and reduces or eliminates the common mode voltage bouncing.

There is an additional benefit for solving EMI problem of the output stage. If the source currents are designed properly, the nodes Lx1 and Lx2 would be kept at a constant voltage, usually half of the supply voltage Vdd, overall period. The common mode voltage of the output then is kept constant without variation so that the EMI issue due to the unstable common mode voltage can be avoided.

Figure 10:
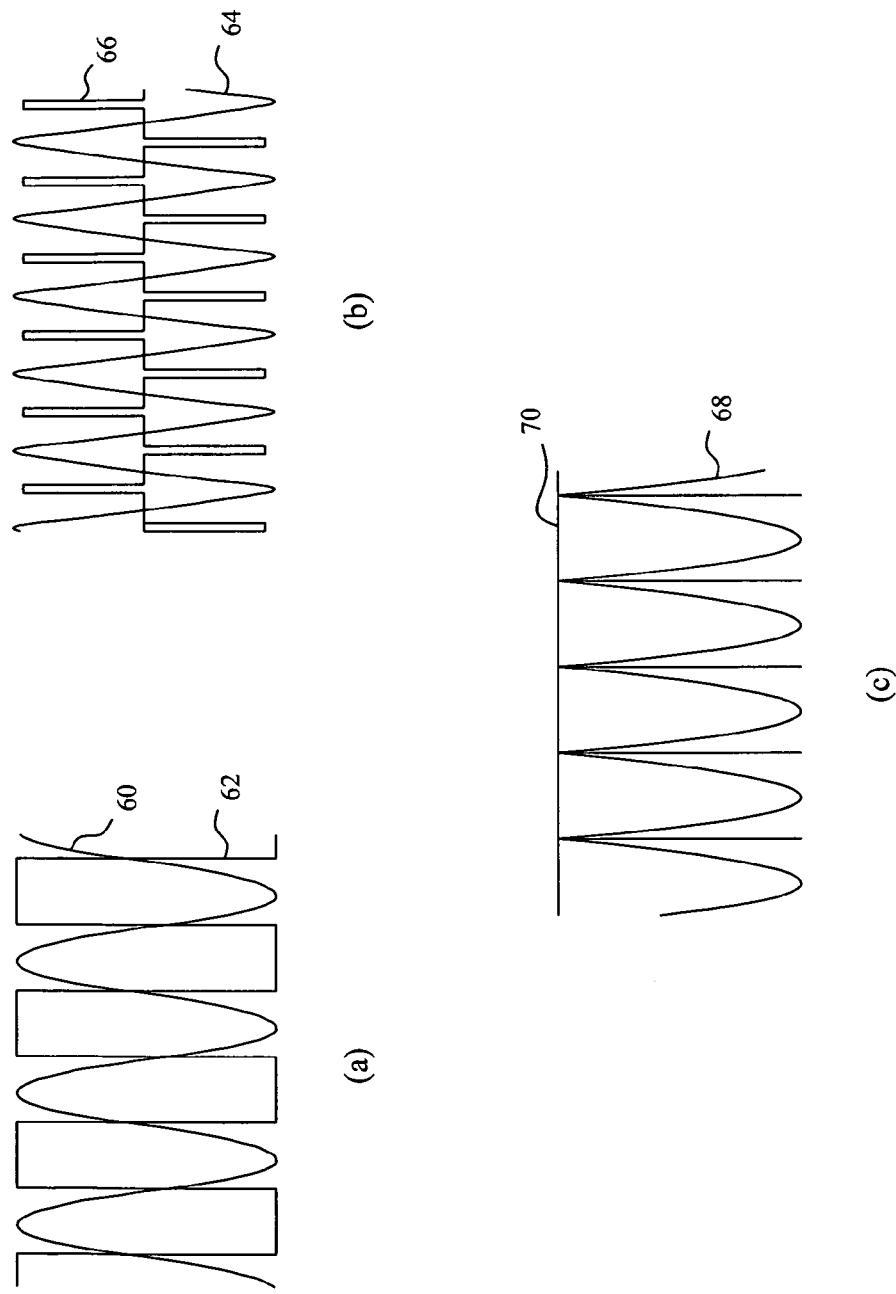
FIG. 10 a waveform diagram showing the output waveform of a conventional switching amplifier, a general ternary modulation switching amplifier with a minimum pulse width, and a switching amplifier according to the present invention at zero-input, respectively.

FIG. 10 is a waveform diagram of the output currents IL at zero input (Vin=0) of (a) a conventional switching amplifier, (b) a general ternary modulation switching amplifier with minimum pulse width, and (c) a switching amplifier according to the present invention. As shown in FIG. 10(a), the conventional switching amplifier has a large load current 60 and an output voltage 62 switched between two levels. The general ternary modulation switching amplifier with minimum pulse width, as shown in FIG. 10(b), has a load current 64 slightly smaller than that of FIG. 10(a), and an output voltage 66 staying at zero most of the time but having a minimum pulse width. As shown in FIG. 10(c), the switching amplifier according to the present invention has a very small load current 68 and a constant output voltage 70.

As illustrated by the above embodiments, by adding proper current source(s), the power dissipation can be reduced without the need to generate a minimum pulse width to offer the output current at zero input. In addition, the output common voltage would be kept at a specific voltage to avoid the EMI affection due to the variable common mode voltage at the output.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation to encompass all such modifications and similar arrangements.

What is claimed is:

1. An apparatus for reducing the power consumption and electromagnetic interference of a switching amplifier having a first output terminal and a second output terminal for connecting with a load, and an H-bridge connected between a power input terminal and a ground terminal, being switched according to an input signal to generate an output voltage across the two output terminals, and a common mode voltage existing across the two output terminals at zero input, the apparatus comprising:
    a first current source and a first resistor connected in series between the power input terminal and the first output terminal; and
    a second resistor and a second current source connected in series between the second output terminal and the ground terminal;
    whereby a small current is supplied to the load at zero input to reduce the common mode voltage bouncing.

2. The apparatus of claim 1, wherein the first and second resistors have a same resistance.

3. The apparatus of claim 1, wherein the first and second current sources have a same sourcing current.

4. The apparatus of claim 1, wherein a voltage across the two output terminals due to the small current flowing through the load.

5. The apparatus of claim 1, wherein the small current is less than 10 μA.

6. The apparatus of claim 1, wherein the common mode voltage is kept constant due to the small current flowing through the load.

7. The apparatus of claim 6, wherein the common mode voltage is a half of the supply voltage at the power input terminal.

8. The apparatus of claim 1, further comprising:
    a third resistor and a third current source connected in series between the first output terminal and the ground terminal; and
    a fourth resistor and a fourth current source connected in series between the power input terminal and the second output terminal.

9. The apparatus of claim 8, wherein the four resistors have a same resistance.

10. The apparatus of claim 8, wherein the four current sources have a same sourcing current.

11. The apparatus of claim 8, wherein a voltage across the two output terminals due to the small current flowing through the load.

12. The apparatus of claim 8, wherein the common mode voltage is kept constant due to the small current flowing through the load.

13. The apparatus of claim 12, wherein the common mode voltage is a half of the supply voltage at the power input terminal.

14. A method for reducing the power consumption and electro-magnetic interference of a switching amplifier having a first output terminal and a second output terminal for connecting with a load, and an H-bridge connected between a power input terminal and a ground terminal, being switched according to an input signal to generate an output voltage across the two output terminals, and a common mode voltage existing across the two output terminals at zero input, the method comprising the steps of:
    connecting a network including current sources and resistors to the two output terminals; and
    supplying a small current from the network to the load through the resistors at zero input to reduce the common mode voltage bouncing.

15. The method of claim 14, wherein the small current flows through the load to generates a voltage across the two output terminals.

16. The method of claim 14, wherein the small current is less than 10 μA.

17. The method of claim 14, wherein the small current keeps the common mode voltage constant.

18. The method of claim 17, wherein the common mode voltage is a half of the supply voltage at the power input terminal.

19. A switching amplifier, comprising:
    an H-bridge connected between a power input terminal and a ground terminal;
    a first and a second output terminal extended from the H-bridge to be connected with a load therebetween;
    a controller connected to the H-bridge to switch the H-bridge according to an input signal so as to generate an output voltage across the two output terminals, wherein a common mode voltage exists across the two output terminals at zero input; and
    a network including current sources and resistors connected to the two output terminals to supply a small current to the load through the resistors at zero input in order to reduce the common mode voltage bouncing.

20. The switching amplifier of claim 19, wherein the small current flows through the load to generate a voltage across the two output terminals.

21. The switching amplifier of claim 19, wherein the small current is less than 10 μA.

22. The switching amplifier of claim 19, wherein the common mode voltage is kept constant due to the small current flowing through the load.

23. The switching amplifier of claim 22, wherein the common mode voltage is a half of the supply voltage at the power input terminal.

24. A control method for a switching amplifier having a first output terminal and a second output terminal for connecting with a load, the control method comprising the steps of:
    according to an input signal, switching an H-bridge connected between a power input terminal and a ground terminal to generate an output voltage across the two output terminals in a first state;
    switching the H-bridge according to the input signal to generate a common mode voltage across the two output terminals in a second state; and
    supplying a small current from a network including current sources and resistors to the load through the resistors to reduce the common mode voltage bouncing in the second state.

25. The control method of claim 24, wherein the small current flows through the load to generate a voltage across the two output terminals.

26. The control method of claim 24, wherein the small current is less than 10 µA.

27. The control method of claim 24, wherein the common mode voltage is kept constant due to the small current flowing through the load.

28. The control method of claim 27, wherein the common mode voltage is a half of the supply voltage at the power input terminal.

29. The control method of claim 24, wherein the second state is one when the input signal is zero.

* * * * *